United States Patent [19]
Evans et al.

[11] Patent Number: 5,971,806
[45] Date of Patent: Oct. 26, 1999

[54] ELECTRICAL CONNECTOR FOR CONNECTING CONDUCTOR AREAS OF A FLEXIBLE CIRCUIT WITH ASSOCIATED CONDUCTOR PADS OF A CIRCUIT BOARD

[75] Inventors: Robert F. Evans, Bedford, N.H.; Jose L. Ortega, Camp Hill, Pa.

[73] Assignee: Berg Technology, Inc., Reno, Nev.

[21] Appl. No.: 08/979,766

[22] Filed: Nov. 26, 1997

[51] Int. Cl.[6] ................................................. H01R 23/70
[52] U.S. Cl. .............................................. 439/632; 439/67
[58] Field of Search .................................. 439/67, 65, 77, 439/492, 632, 60, 62, 630

[56] References Cited

U.S. PATENT DOCUMENTS

| | | | |
|---|---|---|---|
| 3,334,325 | 8/1967 | Conrad et al. | 339/14 |
| 3,407,379 | 10/1968 | Nakazawa et al. | 339/176 |
| 3,614,707 | 10/1971 | Kaufmann et al. | 439/59 |
| 3,689,865 | 9/1972 | Pierini et al. | 339/17 L |
| 4,613,193 | 9/1986 | Beers | 339/17 L |
| 4,659,155 | 4/1987 | Walkup et al. | 339/14 R |
| 4,740,867 | 4/1988 | Roberts et al. | 361/398 |
| 4,911,387 | 2/1978 | Sochor | 439/329 |
| 4,911,643 | 3/1990 | Perry et al. | 439/67 |
| 4,938,702 | 7/1990 | English | 439/67 |
| 5,024,609 | 6/1991 | Piorunneck | 439/637 |
| 5,051,099 | 9/1991 | Pickles et al. | 439/108 |
| 5,076,803 | 12/1991 | Mutarelli et al. | 439/493 |
| 5,239,748 | 8/1993 | Hamilton | 29/843 |
| 5,240,420 | 8/1993 | Roberts | 439/62 |
| 5,350,319 | 9/1994 | Roberts | 439/632 |
| 5,421,738 | 6/1995 | Roberts | 439/260 |
| 5,433,616 | 7/1995 | Walden | 439/62 |
| 5,496,180 | 3/1996 | Fabian et al. | 439/60 |
| 5,507,651 | 4/1996 | Tanaka et al. | 439/67 |
| 5,639,265 | 6/1997 | Nishio et al. | 439/637 |

*Primary Examiner*—Khiem Nguyen
*Assistant Examiner*—Michael C. Zarroli
*Attorney, Agent, or Firm*—Brian J. Hamilla; Daniel J. Long; M. Richard Page

[57] ABSTRACT

A connector for connecting electrical conductor areas of flexible circuits with associated conductor pads of an edge connector portion of a circuit board, comprising a connector housing having a circuit board opening sized to at least partially accommodate the edge connector portion, and a further opening allowing passage of the flexible circuits into an interior cavity of the connector housing. A first spring and second spring each have a resilient arched feature for supporting one of the flexible circuits to resiliently bias an electrical conductor area of the associated flexible circuit into electrical contact with associated conductor pads when the connector engages the edge connector portion. The electrical conductor areas of the flexible circuits face each other. At least one of the springs is bent so as to have a first L shaped portion and a second L shaped portion at an end thereof, with the second L shaped portion being oriented approximately 90 degrees offset to the first L shaped portion, and one end of the first L shaped portion contacting one end of the second L shaped portion. The springs resiliently urge the flexible circuits to provide electrical contact with the conductor pads of the edge connector portion when the connector is attached at a desired location to the circuit board.

22 Claims, 12 Drawing Sheets

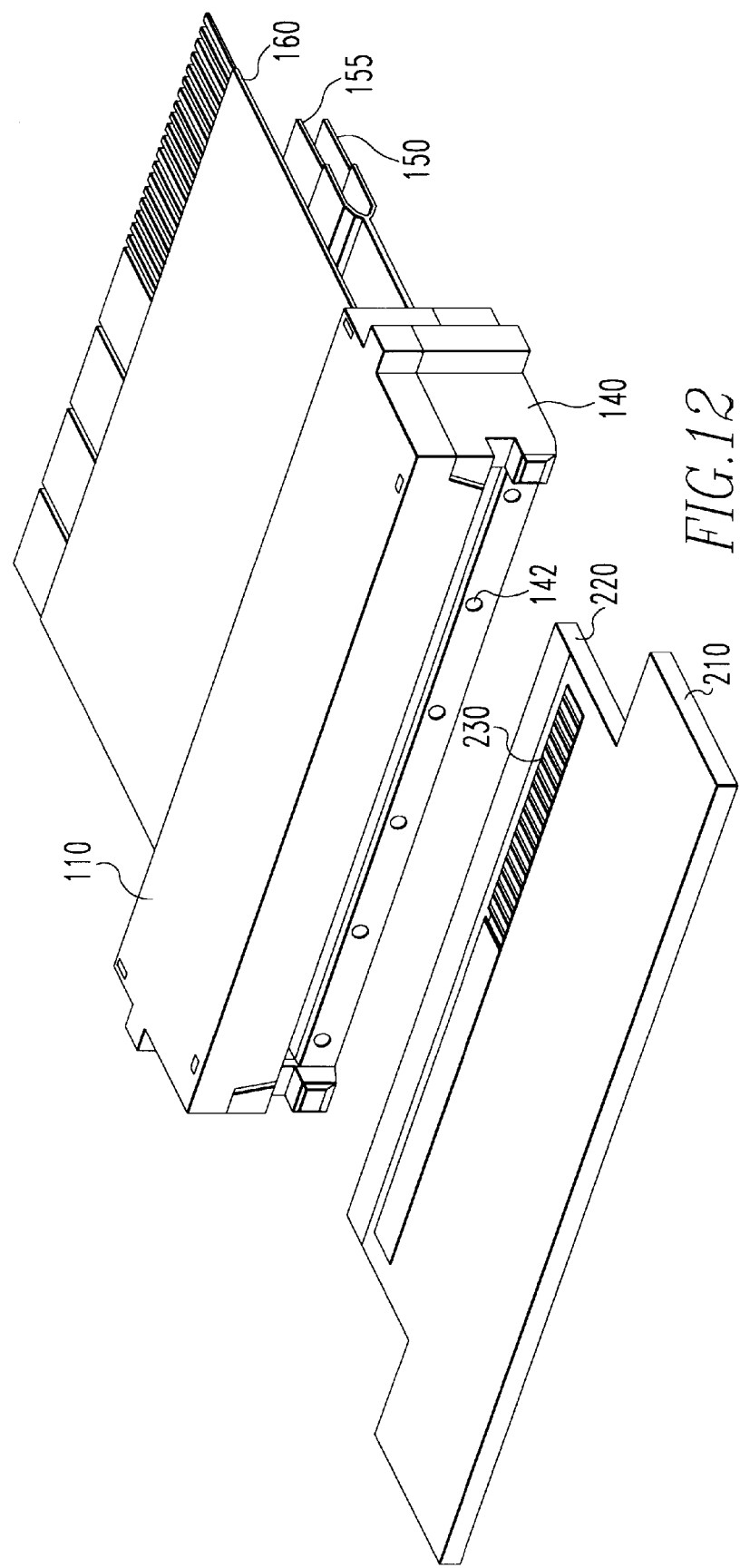

ELECTRICAL CONNECTOR FOR CONNECTING CONDUCTOR AREAS OF A FLEXIBLE CIRCUIT WITH ASSOCIATED CONDUCTOR PADS OF A CIRCUIT BOARD

FIELD OF THE INVENTION

The present invention relates in general to electrical connectors. More particularly, the present invention relates to a structure for releasably connecting contacts of a circuit to conductive pads on a printed circuit board.

BACKGROUND OF THE INVENTION

In electrical arts, it is a common practice to use a connector to mechanically and electrically couple one printed circuit board (PCB) to another PCB. In such a practice, there has been an evolution towards placing electrical contacts closer and closer together while maintaining a high, constant stress between the electrical contact and the areas to be contacted. In electrical systems, flexible printed circuits are employed as electrical jumpers or cables for interconnecting rows of terminal pins or pads of printed circuit boards (PCBs). A connector, mounted to one or both ends of the jumper, is formed with a set of electrical receptacles or sockets which is designed to receive the terminal posts or contact the pads on the PCB.

A primary focus of manufacturers is to increase the circuit density associated with interconnecting the sub-assemblies and components found within their products. This leads to higher density modules, each requiring multiple interconnections to other modules. However, major problems with connectors having closely spaced contacts include the problems of cross-talk, lack of controlled impedance, and increased inductance.

Although the art of connectors is well developed, there remain some problems inherent in this technology. Therefore, a need exists for a connector structure and assembly that reduces cross-talk, controls impedance, and reduces inductance as connector density increases.

SUMMARY OF THE INVENTION

The present invention provides a structure for releasably connecting contacts of a circuit to conductive pads on a circuit board that reduces cross-talk, controls impedance, and reduces inductance as connector density increases. A plurality of springs that bias associated electrical conductor areas of flexible circuits can be formed in parallel to contact a plurality of pads on a circuit board. This plurality of springs, which are co-planar and in parallel, reduces cross-talk, controls impedance, and reduces inductance in high density connectors.

The present invention is directed to a connector for connecting respective electrical conductor areas of a plurality of flexible circuits with associated conductor pads of an edge connector portion of a circuit board, comprising: a connector housing having a circuit board opening sized to at least partially accommodate the edge connector portion, and a further opening 116 allowing passage of the flexible circuits into an interior cavity of the connector housing; a first spring having a resilient arched feature for supporting one of the flexible circuits to resiliently bias an electrical conductor area of the flexible circuit into electrical contact with associated conductor pads when the connector engages the edge connector portion; and a second spring having a resilient arched feature for supporting another of the flexible circuits to resiliently bias an electrical conductor area of the other flexible circuit into electrical contact with associated conductor pads when the connector engages the edge connector portion, the electrical conductor area of the other flexible circuit facing the electrical conductor area of the first flexible circuit. At least one of the springs is bent so as to have a first L shaped portion and a second L shaped portion at an end thereof, the second L shaped portion being oriented approximately 90 degrees offset to the first L shaped portion, one end of the first L shaped portion contacting one end of the second L shaped portion. The springs resiliently urge the flexible circuits to provide electrical contact with the conductor pads of the edge connector portion when the connector is attached at a desired location to the circuit board.

In a further embodiment within the scope of the present invention, the connector housing comprises: a cover; a first insertion portion connected to the cover, the first insertion portion supporting the first spring; a second insertion portion connected to the first insertion portion to form the circuit board opening and the further opening 116, the second insertion portion supporting the second spring; and a base connected to the first and second insertion portions. The first and second insertion portions comprise compression support lead frames. The cover, the first and second insertion portions, and the base have resilient snap connector features to engage and retain the cover, the first and second insertion portions, and the base together as a unit in desired positions relative to one another. The cover, the first and second insertion portions, and the base have alignrent features to facilitate desired registration with each other.

In another embodiment within the scope of this invention, the edge connector portion has a farther conductor pad, and the connector further comprises: a third spring for resiliently biasing an electrical conductor area of a further flexible circuit into electrical contact with the further conductor pad when the connector engages the edge connector portion, the third spring having a resilient arched feature; and the third spring supporting the future flexible circuit to resiliently urge the future flexible circuit to provide electrical contact with the further conductor pad of the edge connector portion when the connector is attached at a desired location to the circuit board.

According to another aspect of the present invention, a connector for electrically conductive connection to a row of electrically conductive contact pads of a circuit comprises: a rigid housing; a flexible circuit housed, at least in part, in the housing, and having an end portion defining a row of conductive contact areas on one face thereof corresponding to the row of electrically conductive contact pads; spring means held captive by the housing, and means for attaching the flexible circuit to the spring means so that the contact areas are resiliently urged by the arched feature into electrically conductive contact with the pads when the connector is attached at a desired location to the circuit. The connector is for connection to an edge portion of the circuit, the edge portion having opposed faces each carrying a row of the electrically conductive contact pads, wherein the housing houses a separate spring means associated with each the row of pads; each the spring means includes a first plurality of springs each having an arched portion and each corresponding to at least one the contact area; and a separate flexible circuit is provided for each row of pads, each located and resiliently urged in the same manner. The arched portions of the first plurality of springs of the separate spring means are arched toward one another and the contact areas of the separate flexible circuits face one another within the housing.

According to another aspect of the present invention, the first plurality of springs are housed in the housing and the spring means includes a second plurality of springs which extend from the housing each corresponding to a contact area of another flexible circuit; the contact areas of the other flexible circuit are positioned to be resiliently urged by the second plurality of springs into contact with a secondary row of conductive contact areas on the circuit, when the connector is attached to the circuit. The first and second pluralities of springs are separate and the springs of the second plurality of springs each include an arched portion positioned to provide the resilient urging of the contact areas of the other flexible circuit into conductive contact with the secondary row of conductive contact areas on the circuit.

According to another aspect of the present invention, the housing has an opening for locating and receiving an edge portion of the circuit carrying the contact pads in a row extending along the edge portion and the contact areas of the flexible circuit electrically conductively contact the pads when the edge portion is inserted into the opening.

According to another aspect of the present invention, the spring means includes a first plurality of parallel springs each having an arched feature and each corresponding to at least one contact area of the row of conductive contact areas.

The foregoing and other aspects of the present invention will become apparent from the following detailed description of the invention when considered in conjunction with the accompanying drawing.

BRIEF DESCRIPTION OF THE DRAWING

FIG. 12 is a perspective front view of an exemplary connector shown with a portion of a printed circuit having an edge connector portion carrying a plurality of electrically conductive contact pads.

DESCRIPTION OF EXEMPLARY EMBODIMENTS AND BEST MODE

Figure 1:
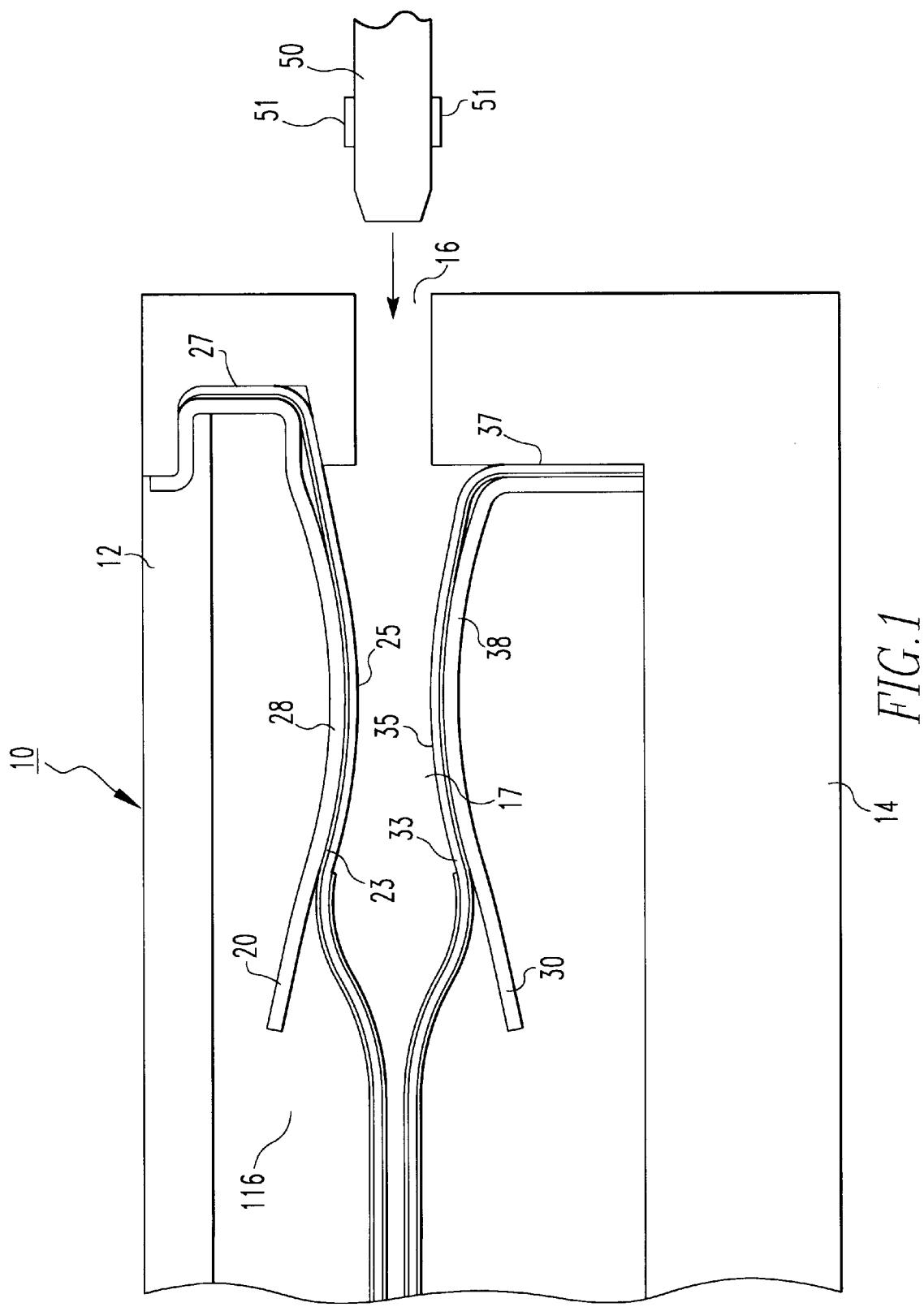
FIG. 1 is a cross-sectional view of an exemplary connector in accordance with the present invention.

FIG. 1 shows a cross-sectional view of an exemplary connector 10 in accordance with the present invention. The connector 10 comprises a molded plastic housing consisting of first and second housing halves 12 and 14. In this embodiment, the housing halves act as insertion portions, as described below. The housing halves 12 and 14 are spaced apart by an insulating spacer (not shown) and joined together by a support ring (not shown) to form the housing. The first and second housing halves 12 and 14, when joined together, form an edge connector receiving aperture 16 at one end thereof.

The internal components of the connector 10 consist of a pair of spring means 20 and 30 and a pair of flexible circuits 23 and 33. The spring means and flexible circuits are inserted so that free ends 27 and 37 are secured against wall portions of the housing. It should be noted that while FIG. 1 shows one pair of spring means 20 and 30, a plurality of pairs of spring means can be arranged in parallel with each other in a row to provide a plurality of contacts within the connector, as described below with respect to FIG. 8A. Each circuit 23, 33 comprises a flexible substrate carrying at least one, and typically a plurality of, electrical conductors terminating in electrically conductive circuit areas 25 and 35 towards an end portion of the flexible circuit within the connector 10. The circuit areas 25 and 35 are positioned to connect with electrically conductive pads 51 on a substrate 50 of a printed circuit board (PCB) when the connector 10 is attached to an edge connector portion of the PCB. It should be noted that a PCB carries an array of circuit paths terminating at an edge connector portion in a row of electrically conductive pads 51. A similar row of pads is located on the underside of the PCB with the two rows being superimposed as a mirror image of one another. The edge connector portion containing the electrically conductive pads 51 is inserted into the edge connector receiving aperture 16 of the housing, with each electrically conductive pad 51 contacting a different spring means in the connector. As used herein, "pads" shall be construed to include exposed conductors to which electrical connection is desired.

The flexible circuits 23 and 33 extend into a cavity 17 via a further opening 116 of the housing so that the areas 25 and 35 of the flexible circuit align with the pads 51 of the PCB when the edge connector portion of the PCB is inserted into the connector through the edge connector receiving aperture 16 of the housing. The flexible circuits 23 and 33 are spaced apart by a spacer (not shown) with their contact areas 25 and 35 facing one another, and are biased towards one another by arched portions 28 and 38 of the spring means 20 and 30. The arched portions 28 and 38 are located in the housing and overlap the aperture 17 to resiliently bias the contact areas 25 and 35 of the flexible circuits 23 and 33 into engagement with pads 51 of a PCB to which the connector is attached.

Figure 2A:
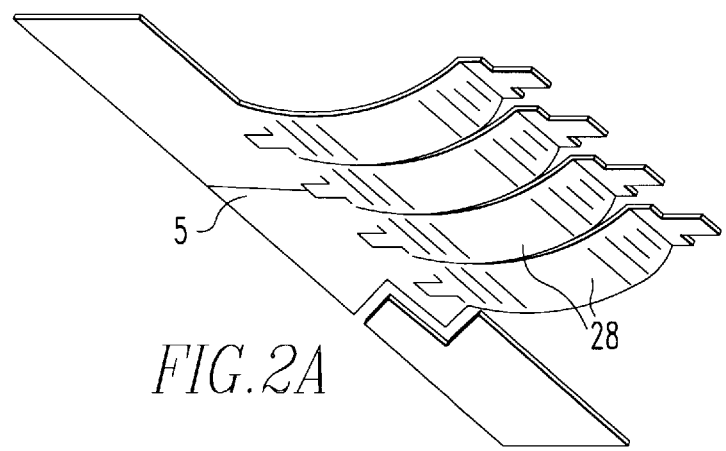
FIG. 2A is an exemplary structure of a plurality of spring means in accordance with the present invention.

Each spring means 20 and 30 is a metal structure, and preferably is a comb-like metal structure in which, when more than one pair of spring means is present to contact a plurality of pads arranged in a row on a PCB, the arched portions are formed in parallel portions and interconnected at one end thereof by a cross-member 5, as shown for example in FIG. 2A. The cross-member 5 serves to maintain the spring portions in parallel alignment with one another and to locate the spring means relative to the contact areas 25 and 35 of the flexible circuit 23 and 33 and the cavity 17 of the housing. The ends of each spring means are shaped to define tabs which engage corresponding openings in the end portion of the associated flexible circuit to locate the flexible circuit relative to the spring. Sufficient floating movement of the springs and the flexible circuits is desired to allow the desired alignment between the contact areas 25, 35 and the pads 50 of the PCB. Preferably, the spring means are stamped and formed to have a preloaded spring rate designed to provide the desired normal force at the respective contact surface with the PCB is fully engaged in the connector. The spring means 20, 30 are preferably made from phosphor bronze or other materials having the desired spring characteristics to provide the sufficient normal force. In accordance with the invention, the materials selected and the geometric configuration of the spring means is preferably such that a sufficient normal force is generated at the respective contact areas to assure electrical reliability of the interconnections.

Figure 2B:
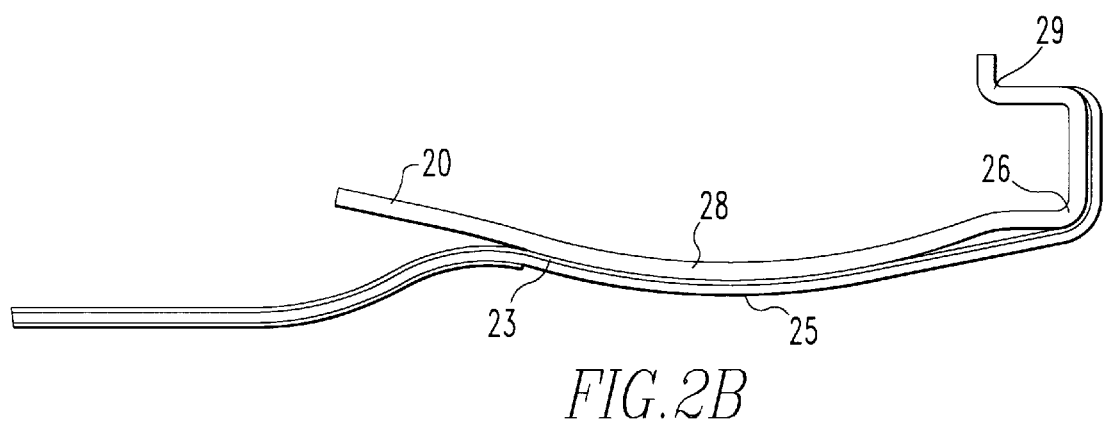
FIG. 2B is a cross-sectional view of an exemplary spring means of the connector of FIG. 1.

As shown in FIG. 2B, the spring means 20 preferably has a first L shaped portion 26 and a second L shaped portion 29 at an end thereof. The second L shaped portion 29 is oriented approximately 90 degrees offset to the first L shaped portion 26, and one end of the first L shaped portion 26 transversely contacts one end of the second L shaped portion 29. This structure provides additional strength to the connector 10 by distributing internal stresses in an optimal manner. The housing half 12 is formed with a groove or slot to accommodate the L shaped portions 26, 29.

The ends of the flexible circuits 23, 33 which are remote from the connector described may be terminated in any conventional manner or may be terminated in a similar connector to that described.

It will be appreciated that the engagement of the springs with their attached flexible circuits ensures that the free ends of the springs and the associated end portions of the flexible circuits 23, 33 do not interfere with the insertion of an edge connector portion of a PCB to the connector. The free end portions of the springs and the cross-member 5 serve to provide the contact with the first and second housing halves 12 and 14 required for the application of the desired spring force by the arched portion of the spring to achieve the desired electrical contact between the contact areas and the pads.

In addition to comprising a material having the desired spring characteristics as described above, the spring means 20, 30 may be constructed of a material or coated with a suitable material to provide, with the substrate of the flexible circuits, an impedance desired where the flexible circuit communicates directly with a PCB.

Another embodiment of the invention will now be described with reference to FIGS. 3 through 5. The connector 40 of FIG. 3 includes elements similar to those described above and construction features which function substantially in the same way as the features of the embodiment described above with respect to FIGS. 1 and 2 for connection to an edge connector portion of a PCB carrying rows of pads as described above. These elements are labeled identically and their description is omitted for brevity.

Figure 3:
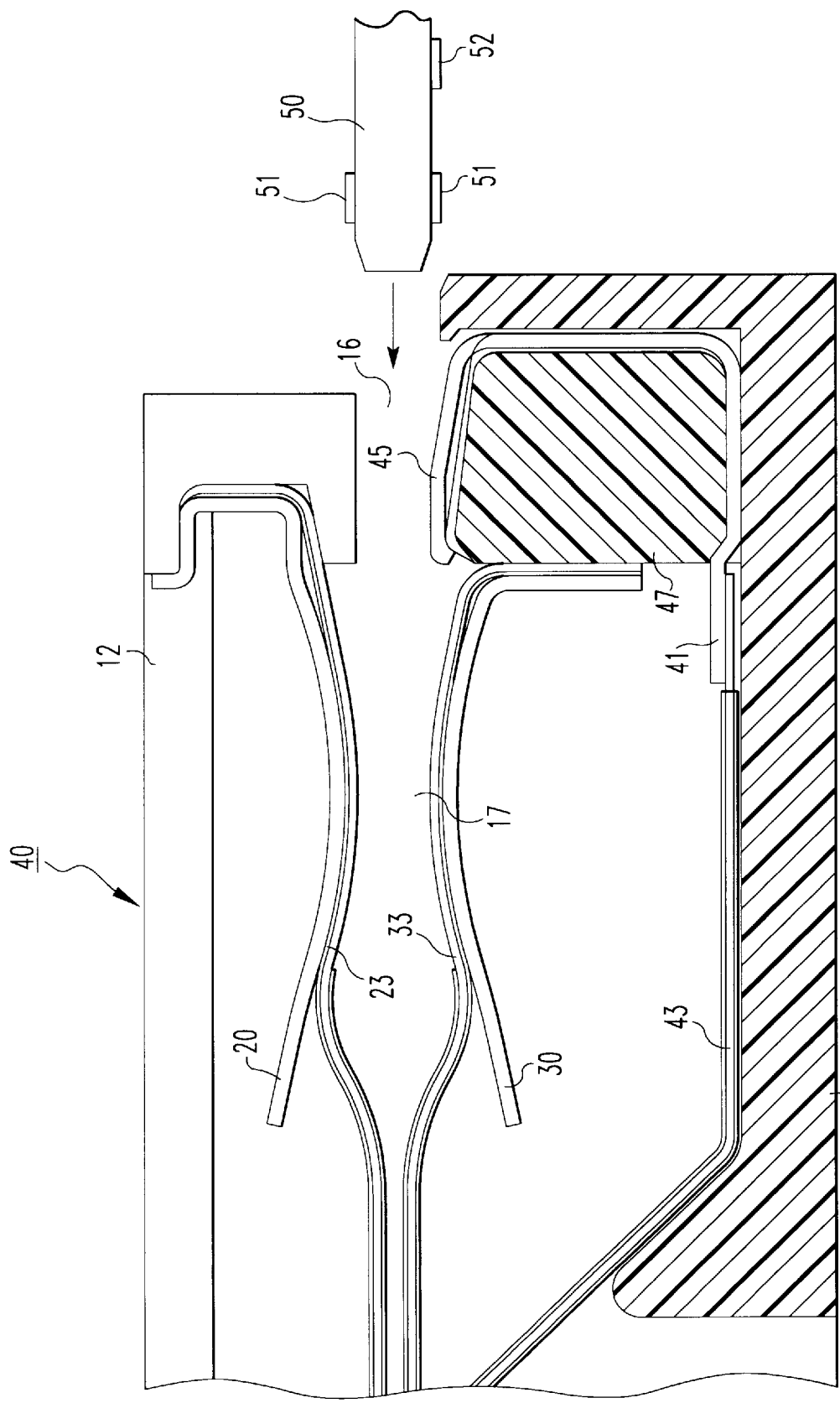
FIG. 3 is a cross-sectional view of another exemplary connector in accordance with the present invention.
Figure 4:
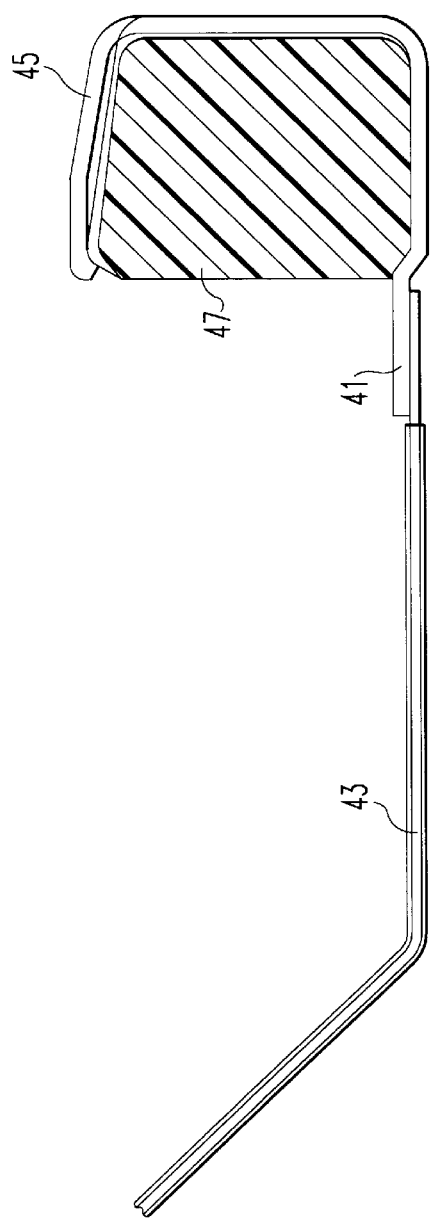
FIG. 4 is a cross-sectional view of an exemplary spring means of the connector of FIG. 3.

The connector 40 of FIG. 3 has an additional spring means 41 and a flexible circuit 43 as shown in FIG. 4. The flexible circuit 43 is coupled to the spring means at an end portion of the spring 41 by a conventional means, preferably soldering. The flexible circuit 43 terminates at an end in electrically conductive area 45. Electrically conductive area 45 is positioned to connect with a secondary set of electrically conductive pads 52 of a PCB when the connector 40 is attached to the edge connector portion of the PCB. The secondary pads 52 are preferably positioned behind the pads 51. The additional spring means 41 and flexible circuit 43 can be used to contact additional voltage and signal connections in the PCB.

The spring means 41 is a metal structure, and preferably is a comb-like metal structure in which, when more than one spring means is present to contact a plurality of pads arranged in a row on a PCB, the arched portions are formed in parallel portions and interconnected at one end thereof by a cross-member, as described above with respect to FIG. 2A. The cross-member maintains the spring portions in parallel alignment with one another and to locate the spring means relative to the contact area 45. Sufficient floating movement of the springs is desired to allow the desired alignment between the contact areas 45 and the pads 52 of the PCB.

A supporting block 47 contains the spring means 41, the flexible circuit 43, and contact areas 45 in a predetermined pitch, preferably 1 mm, and is attached to a secondary plane, preferably copper, by conventional means, including soldering. It should be understood that the present invention can have any suitable pitch between contacts, as tolerances allow.

Figure 5:
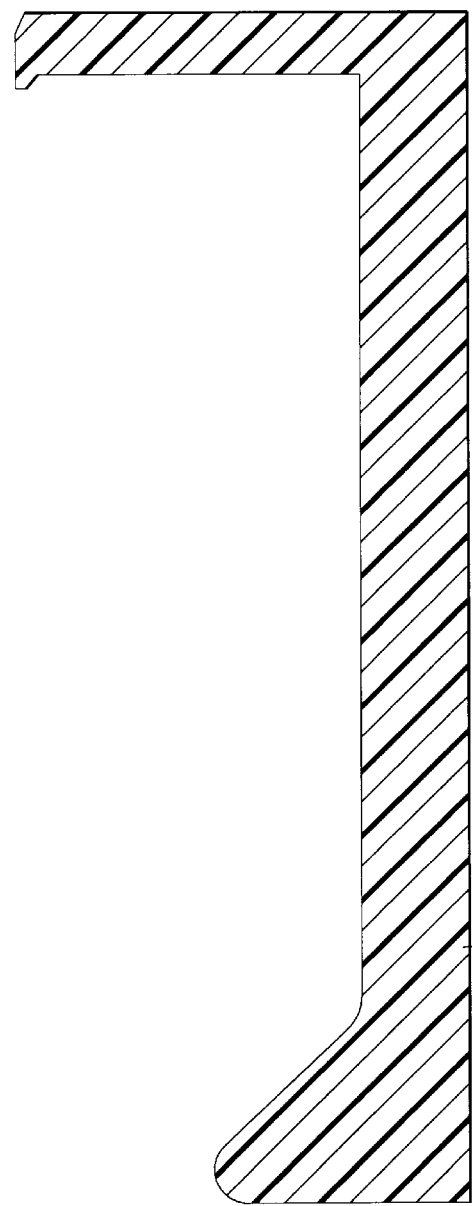
FIG. 5 is a cross-sectional view of an exemplary retaining means of the connector of FIG. 3.

This subassembly is inserted into the main housing and retained by retaining means 60, as shown in FIG. 5. The retaining means 60 preferably comprises plastic and is used for providing additional support to spring means 41 and flexible circuit 43. Retaining means 60 replaces housing half 14 of FIG. 1, as described below with respect to FIG. 8A.

Figure 6:
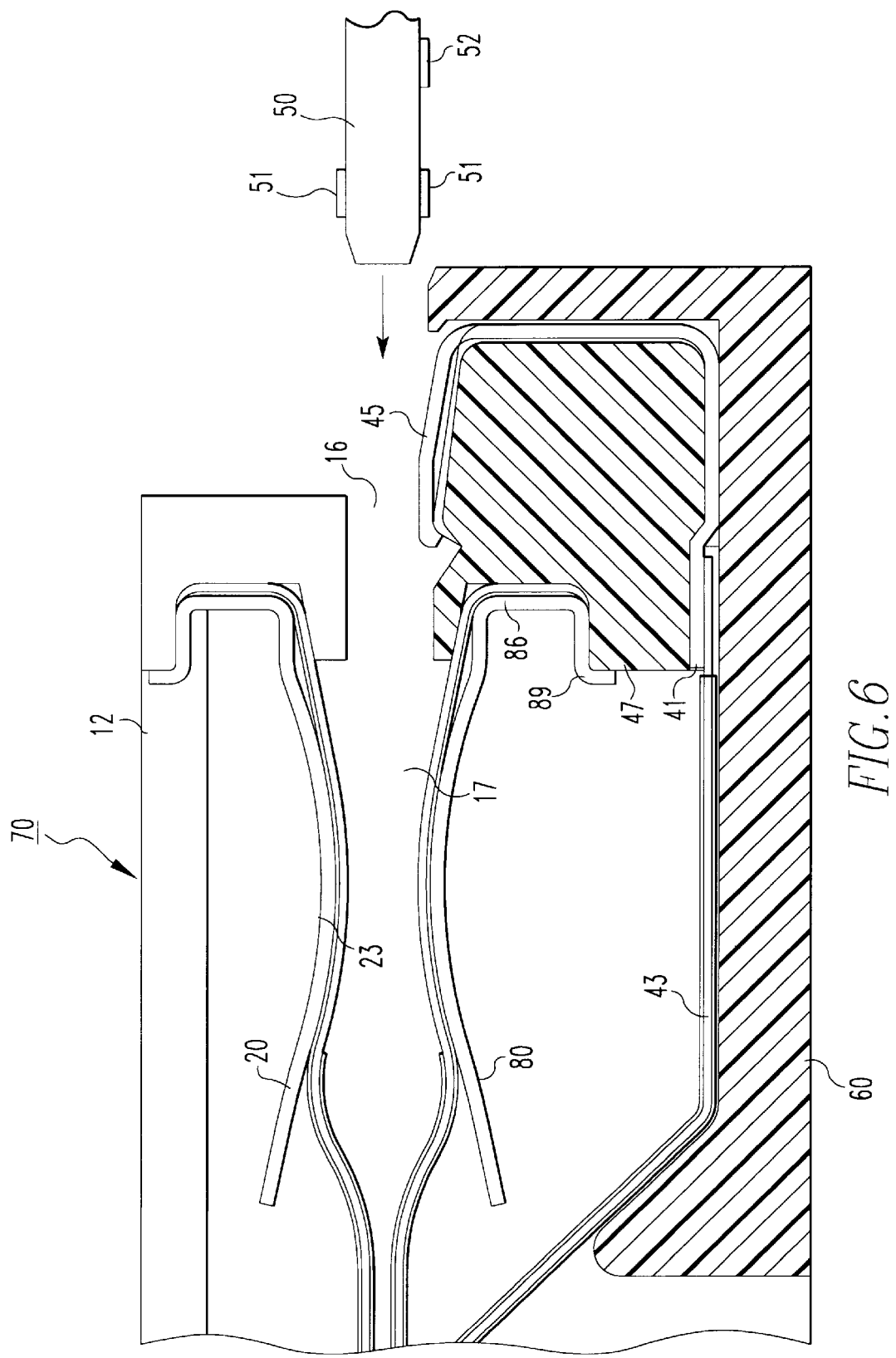
FIG. 6 is a cross-sectional view of another exemplary connector in accordance with the present invention.

FIG. 6 is a cross-sectional view of another exemplary connector 70 in accordance with the present invention. The connector of FIG. 6 contains elements similar to those described above with respect to FIGS. 1 and 3. These elements are labeled identically and their description is omitted for brevity. The exemplary connector 70 is similar to that shown in FIG. 3; however, in this embodiment, spring means 30 is replaced by spring means 80 that is substantially identical to spring means 20. The spring means 80 has a first L shaped portion 86 and a second L shaped portion 89 at an end thereof. The second L shaped portion 89 is oriented approximately 90 degrees offset to the first L shaped portion 86, and one end of the first L shaped portion 86 contacts one end of the second L shaped portion 89. This structure provides additional strength to the connector 70 by distributing internal stresses in an optimal manner. The supporting block 47 is formed with a groove or slot to accommodate end portion of the spring means 80. In this manner, additional strength is provided to the connector 70.

Figure 7:
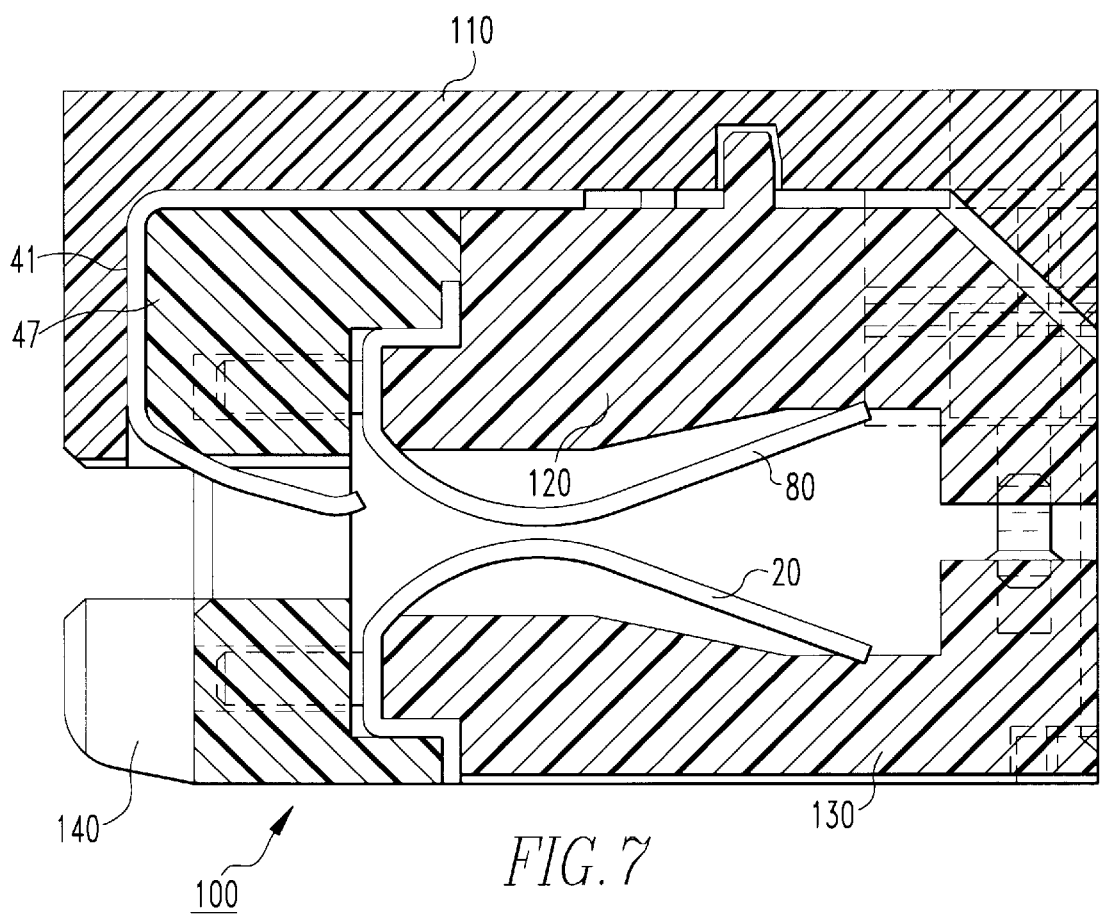
FIG. 7 is a cross-sectional view of another exemplary connector in accordance with the present invention.

FIG. 7 is a cross-sectional view of an exemplary connector similar to the connector shown in FIG. 6. The connector of FIG. 7 is shown inverted with respect to the orientation of FIG. 6 and is contained within a housing 100. The housing 100 comprises a cover 110, a first insertion portion 120, a second insertion portion 130, and a base 140. The insertion portions 120 and 130 are compression support lead frames which connect together to form a slot entry for a PCB to be inserted. Preferably, the housing is made of plastic. The cover 110 corresponds to retaining means 60 of FIG. 5. The insertion portions 120 and 130 are used to provide support to the spring means 20 and 80 and their associated flexible circuits. The base 140 is used to provide support to the additional spring means 41. Various holes and pins corresponding to connection points between the various components are shown in dashed lines.

Figure 8A:
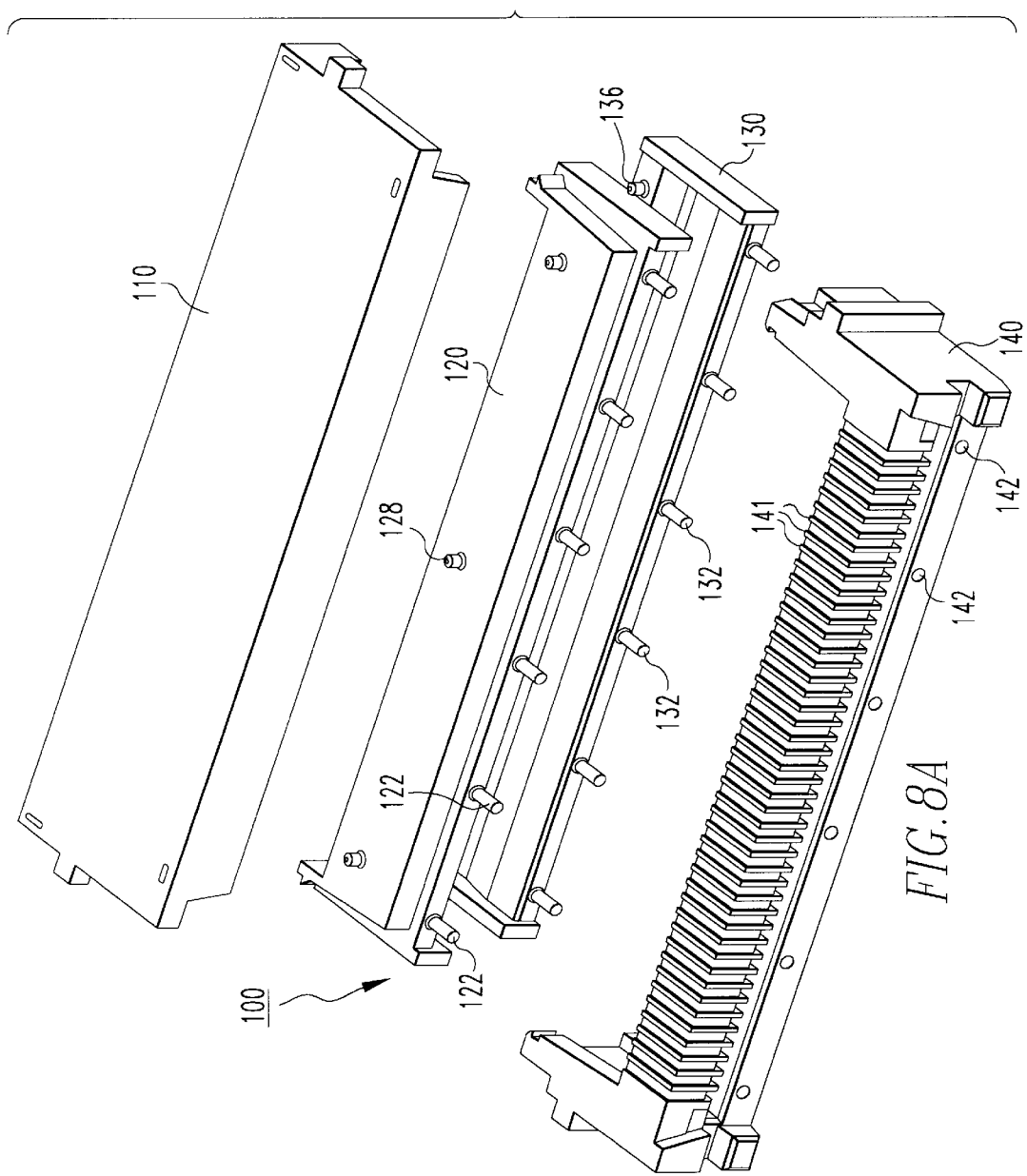
FIGS. 8A and 8B show front and rear exploded perspective views, respectively, of an exemplary housing in accordance with the present invention.
Figure 8B:
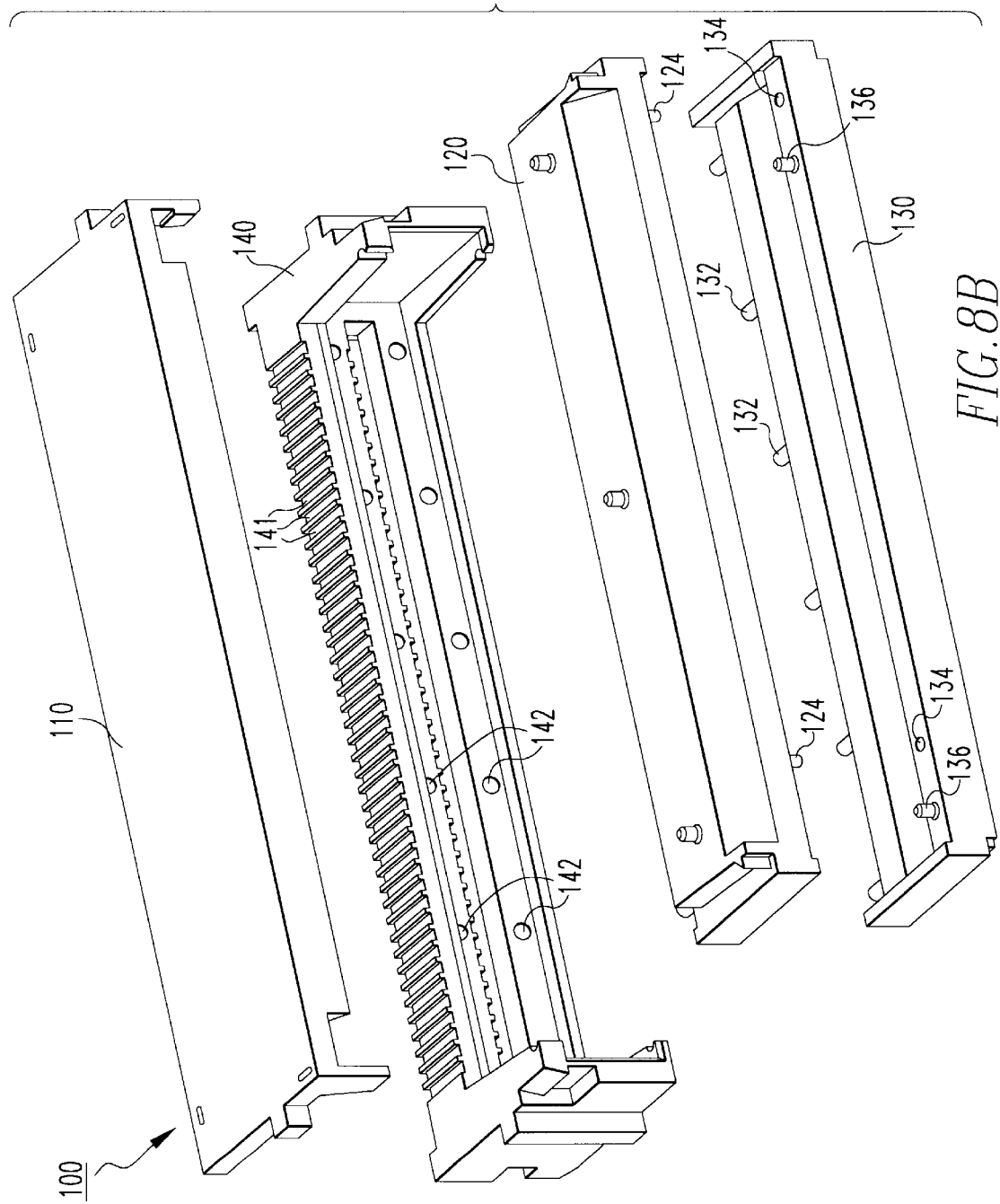

FIGS. 8A and 8B show front and rear exploded perspective views, respectively, of the housing 100. A plurality of the spring means can be formed in parallel alignment with one another to contact a plurality of pads on a PCB. A plurality of conductors (preferably copper) are spaced apart to keep the impedance and inductance low. FIGS. 8A and 8B show a row of the additional spring means 141 (the pair of spring means 20 and 80 from FIG. 7 is not shown). The conductors come into intimate contact with pads on the substrate of the PCB. The base 140 has two rows of slots or holes 142 which are used as connection points for insertion portions 120 and 130. Specifically, pins 122 on insertion portion 120 and pins 132 on insertion portion 130 are press-fit or inserted through the respective rows of holes on the base 140 to provide additional support to the connector.

Figure 9:
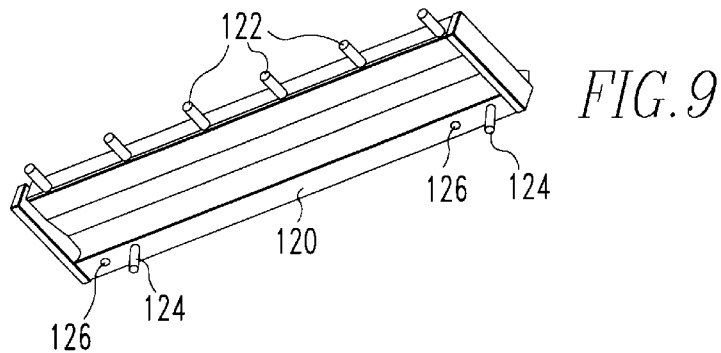
FIG. 9 shows a bottom perspective view of an exemplary insertion portion in accordance with the present invention.

The insertion portions 120 and 130 have pins and openings for connection to each other. Specifically, insertion portion 120 has pins 124 on its underside for insertion into openings 134 on insertion portion 130. Insertion portion 130 has pins 136 for insertion into openings 126 on insertion portion 120 (as shown in a bottom perspective view of the insertion portion 120 in FIG. 9).

Figure 10A:
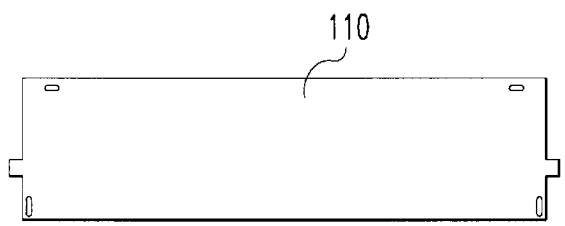
FIGS. 10A through 10D show different views of an exemplary housing cover in accordance with the present invention.
Figure 10B:
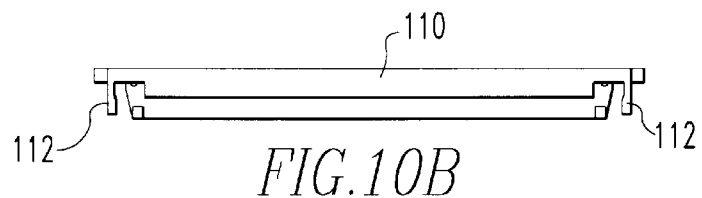
Figure 10C:
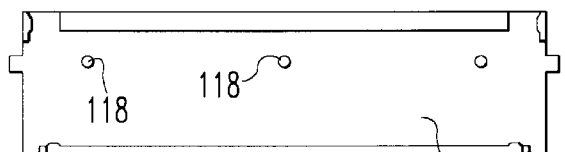
Figure 10D:
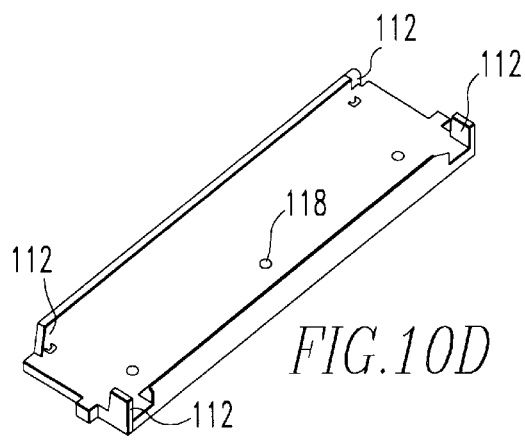

FIGS. 10A through 10D are different views of the cover 110. FIG. 10A is a top view. FIG. 10B is a front side view. FIG. 10C is a bottom view. FIG. 10D is a perspective bottom view. The insertion portion 120 has pins 128 on its upper surface for insertion into openings 118 in the cover 110, as shown in FIG. 10D. The cover 110 has tabs 112 that are used to fasten the cover 110 to the base 140.

Although pins and holes are shown here, any conventional fastening or fixing means, including screws and adhesives, can be used to join the components of the housing 100 to one another.

Figure 11A:
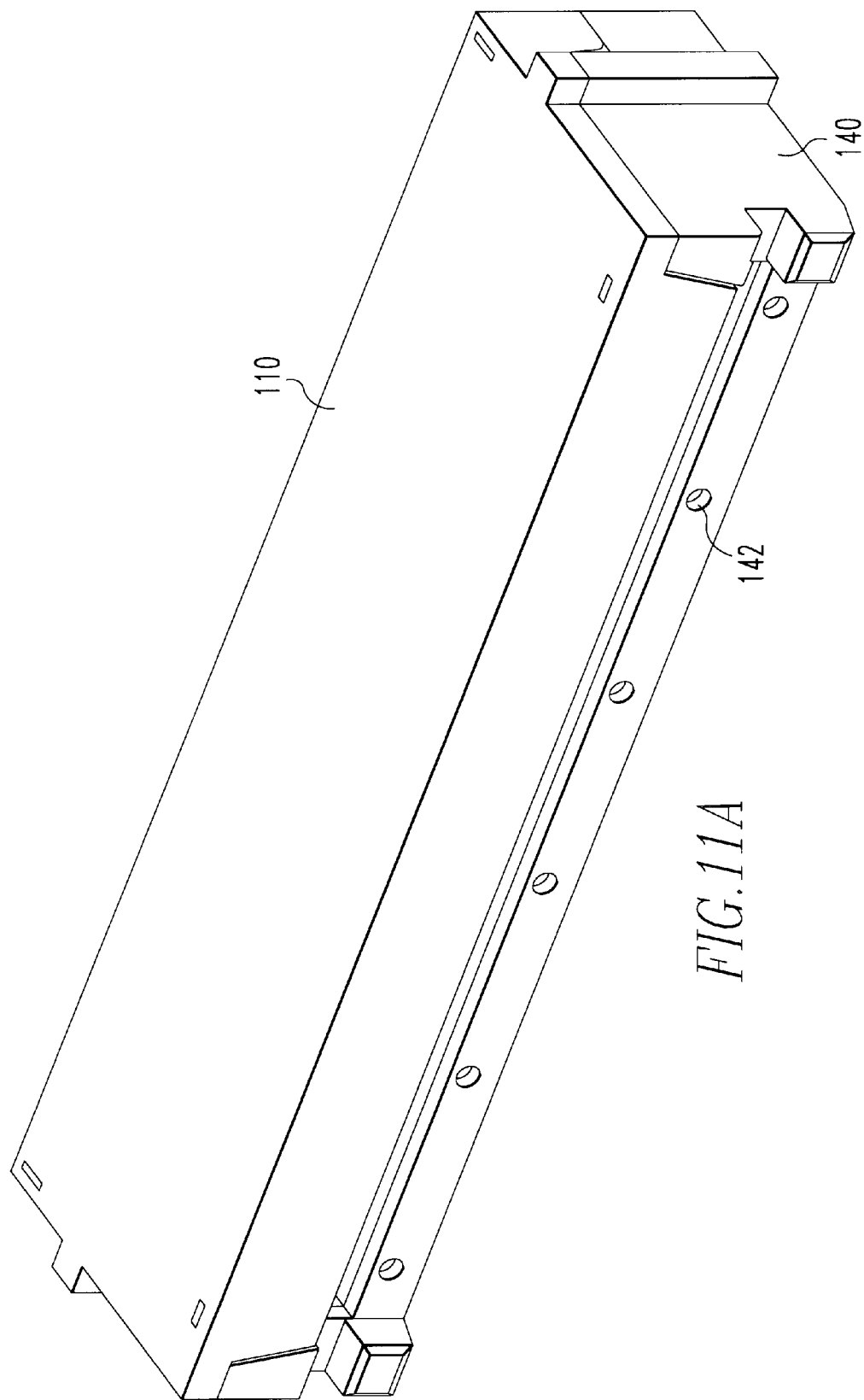
FIGS. 11A and 11B show an assembled housing in accordance with the present invention, with and without a cover, respectively.
Figure 11B:
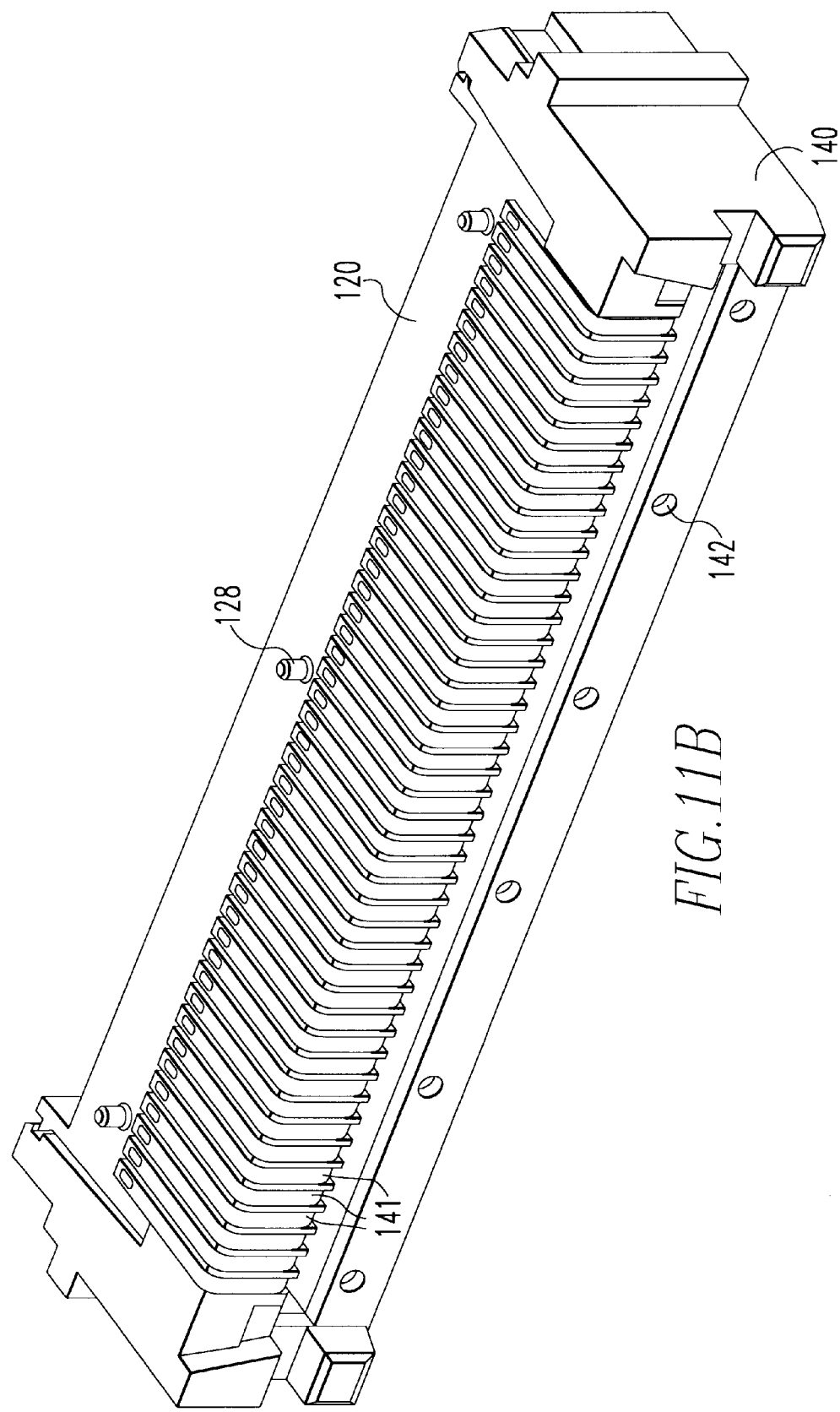

FIGS. 11A and 11B show an assembled housing 100, with and without the cover 110, respectively. The cover 110 is attached to the base 140 by the tabs 112 or other conventional means.

FIG. 12 is a perspective front view of an exemplary connector enclosed in a housing shown with a portion of a printed circuit 210 having an edge connector portion 220 carrying a plurality of electrically conductive contact pads 230. Flexible circuits 150 and 155 correspond to the flexible circuits that are coupled to the spring means that contact the primary PCB pads (e.g., flexible circuits 23 and 33 in FIG. 3). Flexible circuit 160 corresponds to the flexible circuit that is coupled to the spring means and contacts the secondary PCB pads (e.g., flexible circuit 43 in FIG. 3). The ends of the flexible circuits 150, 155, and 160 that are not coupled to the spring means can be connected to, for example, a multi-chip module. Moreover, an exemplary connector in accordance with the present invention together with a second similar connector can be used to interconnect two PCBs, each having edge connector portions carrying rows of electrically conductive contact pads on both faces of each edge portion with the interconnection being by direct communication with contact areas at the ends of the flexible circuits which are common to the connectors.

It will be appreciated that while the embodiments of the present invention have been described utilizing a pair of flexible circuits suitable for communication with contact pads of both faces of a PCB or with two parallel rows of pads on one face of a PCB, the invention is applicable for use with a single spring means/flexible circuit arrangement for communicating with a single row of contact pads of a PCB.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A connector for connecting respective electrical conductor areas of a plurality of flexible circuits with associated conductor pads of an edge connector portion of a circuit board, comprising:

a connector housing having a circuit board opening sized to at least partially accommodate said edge connector portion, and a further opening allowing passage of said flexible circuits into an interior cavity of said connector housing;

a first spring having a resilient arched feature for supporting one of said plurality of flexible circuits to resiliently bias an electrical conductor area of said flexible circuit into electrical contact with associated conductor pads when said connector engages said edge connector portion; and a second spring having a resilient arched feature for supporting another of said plurality of flexible circuits to resiliently bias an electrical conductor area of said another flexible circuit into electrical contact with associated conductor pads when said connector engages said edge connector portion, said electrical conductor area of said another flexible circuit facing said electrical conductor area of said first flexible circuit;

at least one of said springs being bent so as to have a first L shaped portion and a second L shaped portion at an end thereof, said second L shaped portion being oriented approximately 90 degrees offset to said first L shaped portion, one end of said first L shaped portion transversely contacting one end of said second L shaped portion, said second L shaped portion being for mounting of the associated spring to the housing;

said springs resiliently urge said flexible circuits to provide electrical contact with said conductor pads of said edge connector portion when said connector is attached at a desired location to said circuit board.

2. A connector according to claim 1, wherein said connector housing comprises:

a cover;

a first insertion portion connected to said cover, said first insertion portion supporting said first spring;

a second insertion portion connected to said first insertion portion to form said circuit board opening and said further opening, said second insertion portion supporting said second spring; and a base connected to said first and second insertion portions.

3. A connector according to claim 2, wherein said first and second insertion portions comprise compression support lead frames.

4. A connector according to claim 2, wherein said cover, said first and second insertion portions, and said base have resilient snap connector features to engage and retain said cover, said first and second insertion portions, and said base together as a unit in desired positions relative to one another.

5. A connector according to claim 4, wherein said cover, said first and second insertion portions, and said base have alignment features to facilitate desired registration with each other.

6. A connector according to claim 1, wherein said edge connector portion has a further conductor pad, said connector further comprising:

a third spring for resiliently biasing an electrical conductor area of a further flexible circuit into electrical contact with said further conductor pad when said connector engages said edge connector portion, said third spring having a resilient arched feature; and said third spring supporting said further flexible circuit to resiliently urge said further flexible circuit to provide electrical contact with said further conductor pad of said edge connector portion when said connector is attached at a desired location to said circuit board.

7. A connector according to claim 6, wherein said connector housing comprises:

a cover;

a first insertion portion connected to said cover, said first insertion portion supporting said first spring;

a second insertion portion connected to said first insertion portion to form said circuit board opening and said further opening, said second insertion portion supporting said second spring; and a base connected to said first and second insertion portions, said base supporting said third spring.

8. A connector according to claim 7, wherein said cover, said first and second insertion portions, and said base have resilient snap connector features to engage and retain said cover, said first and second insertion portions, and said base together as a unit in desired positions relative to one another.

9. A connector according to claim 8, wherein said cover, said first and second insertion portions, and said base having alignment features to facilitate desired registration with each other.

10. A connector for electrically conductive connection to a row of electrically conductive contact pads of a circuit comprising:

a rigid housing;

a flexible circuit contained within said housing, and having an end portion defining a row of conductive contact areas on one face thereof corresponding to said row of electrically conductive contact pads;

a resilient member held captive by said housing, said resilient member having a resilient arched feature and being bent so as to have a first L shaped portion and a second L shaped portion at an end thereof, said second L shaped portion being oriented approximately 90 degrees offset to said first L shaped portion, one end of said first L shaped portion transversely contacting one end of said second L shaped portion, said second L shaped portion being for mounting of the associated resilient member to the housing;

wherein said flexible circuit is attached to said resilient member so that said contact areas are resiliently urged by said arched feature into electrically conductive contact with said pads when said connector is attached at a desired location to said circuit.

11. A connector according to claim 10, wherein said connector is for connection to an edge connector portion of said circuit, said edge connector portion having opposed faces each carrying a row of said electrically conductive contact pads, wherein said housing houses a separate resilient member associated with each said row of pads;

each said resilient member includes a first plurality of springs each having an arched portion and each corresponding to at least one said contact area; and a separate flexible circuit is provided for each row of pads, each located and resiliently urged in the same manner.

12. A connector according to claim 11, wherein said arched portions of said first plurality of springs of said separate resilient member are arched toward one another and said contact areas of said separate flexible circuits face one another within said housing.

13. A connector according to claim 12, wherein said first plurality of springs are housed in said housing and said resilient member includes a second plurality of springs which extend from said housing each corresponding to a contact area of another flexible circuit;

said contact areas of said another flexible circuit are positioned to be resiliently urged by said second plurality of springs into contact with a secondary row of conductive contact areas on said circuit, when said connector is attached to said circuit.

14. A connector according to claim 13, wherein said first and second pluralities of springs are separate and said springs of said second plurality of springs each include an arched portion positioned to provide said resilient urging of said contact areas of said another flexible circuit into conductive contact with said secondary row of conductive contact areas on said circuit.

15. A connector according to claim 10, wherein said housing has an opening for locating and receiving an edge connector portion of said circuit carrying said contact pads in a row extending along said edge connector portion and said contact areas of said flexible circuit electrically conductively contact said pads when said edge connector portion is inserted into said opening.

16. A connector according to claim 10, wherein said resilient member includes a first plurality of parallel springs each having a said arched feature and each corresponding to at least one contact area of said row of conductive contact areas.

17. A connector according to claim 16, wherein said housing comprises:

a cover;

a first insertion portion connected to said cover, said first insertion portion supporting one row of springs of said parallel springs;

a second insertion portion connected to said first insertion portion to form a circuit opening, said second insertion portion supporting said other row of springs of said parallel springs; and a base connected to said first and second insertion portions.

18. A connector according to claim 17, wherein said first and second insertion portions comprise compression support lead frames.

19. A connector according to claim 17, wherein said cover, said first and second insertion portions, and said base have resilient snap connector features to engage and retain said cover, said first and second insertion portions, and said base together as a unit in desired positions relative to one another.

20. A connector according to claim 19, wherein said cover, said first and second insertion portions, and said base have alignment features to facilitate desired registration with each other.

21. A connector according to claim 1, wherein said one end of said first L shaped portion contacts said one end of said second L shaped portion at an approximately 90 degree angle.

22. A connector according to claim 10, wherein said one end of said first L shaped portion contacts said one end of said second L shaped portion at an approximately 90 degree angle.

* * * * *